US010054643B2

(12) United States Patent
Sankavaram et al.

(10) Patent No.: US 10,054,643 B2
(45) Date of Patent: Aug. 21, 2018

(54) METHOD AND APPARATUS FOR ISOLATING ROOT CAUSE OF LOW STATE OF CHARGE OF A DC POWER SOURCE

(71) Applicant: GM GLOBAL TECHNOLOGY OPERATIONS LLC, Detroit, MI (US)

(72) Inventors: Chaitanya Sankavaram, Sterling Heights, MI (US); Xinyu Du, Oakland Township, MI (US); Shengbing Jiang, Rochester Hills, MI (US); Yilu Zhang, Northville, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 0 days.

(21) Appl. No.: 15/399,947

(22) Filed: Jan. 6, 2017

(65) Prior Publication Data

US 2018/0196106 A1    Jul. 12, 2018

(51) Int. Cl.
| | |
|---|---|
| *F02N 11/08* | (2006.01) |
| *G01R 31/36* | (2006.01) |
| *G07C 5/00* | (2006.01) |
| *G07C 5/08* | (2006.01) |
| *F02N 11/14* | (2006.01) |
| *G01R 31/00* | (2006.01) |

(52) U.S. Cl.
CPC .......... *G01R 31/3624* (2013.01); *F02N 11/14* (2013.01); *G01R 31/007* (2013.01); *G01R 31/3651* (2013.01); *G01R 31/3679* (2013.01); *G01R 31/3693* (2013.01); *G07C 5/008* (2013.01); *G07C 5/0808* (2013.01)

(58) Field of Classification Search
CPC ............ G01R 31/3624; G01R 31/3693; G01R 31/3651; G01R 31/007; G01R 31/3679; G07C 5/0808; G07C 5/008; F02N 11/14; F02N 11/0862; F02N 11/0825; F02N 2200/046; F02N 2200/061; F02N 2300/306; F02N 2200/062; F02N 2200/063; F02N 2200/064; F02N 2250/02
USPC .......... 123/179.3, 179.2; 701/113; 73/114.59
See application file for complete search history.

(56) References Cited

U.S. PATENT DOCUMENTS

| | | | |
|---|---|---|---|
| 8,207,840 B2 | 6/2012 | Zhang et al. | |
| 8,798,832 B2 * | 8/2014 | Kawahara | ........... H01M 10/441 701/22 |
| 9,108,524 B2 | 8/2015 | Zhang et al. | |
| 9,229,704 B2 * | 1/2016 | Throop | ..................... G06F 8/65 |
| 9,784,229 B2 * | 10/2017 | Holub | ................. F02N 11/0807 |

(Continued)

*Primary Examiner* — Hai Huynh
(74) *Attorney, Agent, or Firm* — Quinn IP Law (57) ABSTRACT

A vehicle including an internal combustion engine, a DC power source and a controller are described. The internal combustion engine includes an engine starting system and an electrical charging system. A method for monitoring the DC power source includes determining a State of Charge (SOC) for the DC power source. Upon detecting that the SOC is less than a threshold SOC, routines are executed in the controller to evaluate a plurality of potential root causes associated with the low SOC. At least one of the potential root causes associated with the low SOC may be identified as a candidate root cause, and a fault probability for each of the candidate root causes is determined. One of the candidate root causes is determined to be a final root cause based upon the fault probabilities associated with the candidate root causes.

18 Claims, 3 Drawing Sheets

(56) References Cited

U.S. PATENT DOCUMENTS

| | | | |
|---|---|---|---|
| 9,816,474 B2 * | 11/2017 | Khafagy | ............ F02N 11/0833 |
| 2009/0309530 A1 | 12/2009 | Shin | |
| 2011/0125430 A1 | 5/2011 | Rajagopalan et al. | |
| 2012/0200298 A1 | 8/2012 | Zhang et al. | |
| 2013/0112173 A1 | 5/2013 | Ghoneim et al. | |
| 2014/0222281 A1 | 8/2014 | Ghoneim | |
| 2015/0211469 A1 | 7/2015 | Ghoneim et al. | |

* cited by examiner

METHOD AND APPARATUS FOR ISOLATING ROOT CAUSE OF LOW STATE OF CHARGE OF A DC POWER SOURCE

INTRODUCTION

Vehicles employ electrical systems including DC power sources that supply electrical power to on-vehicle components and systems to effect engine starting and to supply electric power for other needs. A low state of charge (SOC) of the DC power source may lead to an engine non-start event.

SUMMARY

A vehicle including an internal combustion engine, a DC power source and a controller are described. The internal combustion engine includes an engine starting system and an electrical charging system. A method for monitoring the DC power source includes determining a State of Charge (SOC) for the DC power source. Upon detecting that the SOC is less than a threshold SOC, routines are executed in the controller to evaluate a plurality of potential root causes associated with the low SOC. At least one of the potential root causes associated with the low SOC may be identified as a candidate root cause, and a fault probability for each of the candidate root causes is determined. One of the candidate root causes is determined to be a final root cause based upon the fault probabilities associated with the candidate root causes.

An aspect of the disclosure includes determining a fault probability for each of the candidate root causes, a probability of occurrence for each candidate root cause, and a probability of fault for each candidate root cause.

Another aspect of the disclosure includes selecting one of the candidate root causes having the greatest fault probability as the final root cause.

Another aspect of the disclosure includes evaluating a state of health of the DC power source.

Another aspect of the disclosure includes evaluating performance of a charging system disposed to supply electric power to the DC power source.

Another aspect of the disclosure includes evaluating a wake-up current associated with the DC power source.

Another aspect of the disclosure includes evaluating engine operation and vehicle usage related to charging of the DC power source.

Another aspect of the disclosure includes evaluating engine starting events.

The above features and advantages, and other features and advantages, of the present teachings are readily apparent from the following detailed description of some of the best modes and other embodiments for carrying out the present teachings, as defined in the appended claims, when taken in connection with the accompanying drawings.

BRIEF DESCRIPTION OF THE DRAWINGS

One or more embodiments will now be described, by way of example, with reference to the accompanying drawings, in which:

FIG. 2-1 schematically shows a process flowchart associated with a routine for isolating a root cause that may lead to a low SOC condition for the DC power source that is described with reference to an embodiment of the vehicle of FIG. 1, in accordance with the disclosure;

FIG. 2-2 schematically shows a process flowchart for evaluating a charging system as a potential root cause that may lead to a low SOC condition of the DC power source that is described with reference to the vehicle of FIG. 1, in accordance with the disclosure;

FIG. 2-3 schematically shows a process flowchart for evaluating operator usage and vehicle driving patterns as a potential root cause that may lead to a low SOC condition of the DC power source that is described with reference to the vehicle of FIG. 1, in accordance with the disclosure; and FIG. 2-4 schematically shows a process flowchart for evaluating engine cranking events for a plurality of immediately previous trips and associated engine off-times as a potential root cause that may lead to a low SOC condition of the DC power source that is described with reference to the vehicle of FIG. 1, in accordance with the disclosure.

DETAILED DESCRIPTION

The components of the disclosed embodiments, as described and illustrated herein, may be arranged and designed in a variety of different configurations. Thus, the following detailed description is not intended to limit the scope of the disclosure, as claimed, but is merely representative of possible embodiments thereof. In addition, while numerous specific details are set forth in the following description in order to provide a thorough understanding of the embodiments disclosed herein, some embodiments can be practiced without some of these details. Furthermore, the disclosure, as illustrated and described herein, may be practiced in the absence of an element that is not specifically disclosed herein. Moreover, for the purpose of clarity, certain technical material that is understood in the related art has not been described in detail in order to avoid unnecessarily obscuring the disclosure. Furthermore, the drawings are in simplified form and are not to precise scale.

Figure 1:
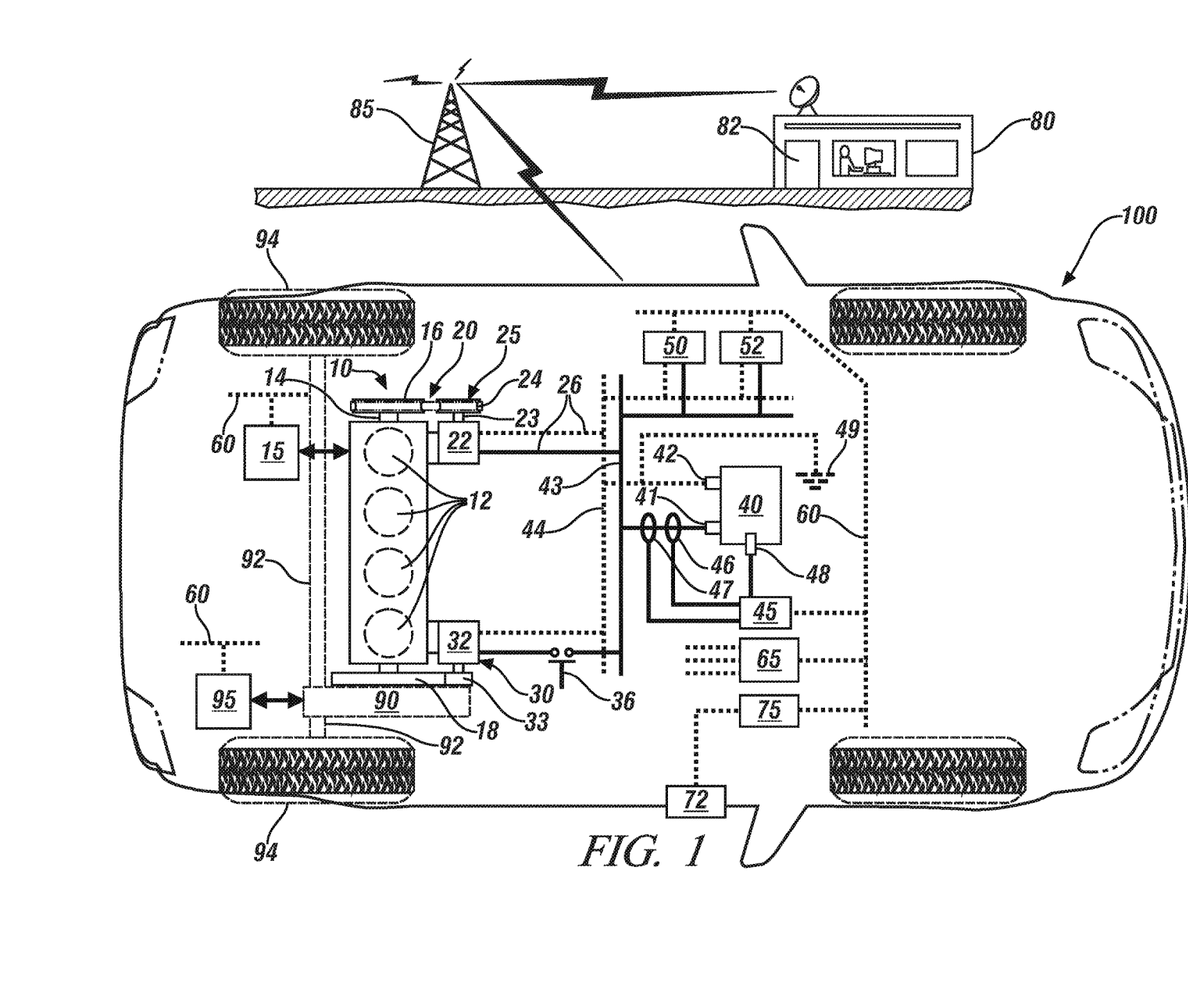
FIG. 1 schematically illustrates an embodiment of an internal combustion engine that may be disposed to supply tractive power in a vehicle and an electric power system that includes a DC power source, in accordance with the disclosure.

Referring to the drawings, wherein like reference numerals correspond to like or similar components throughout the several Figures, FIG. 1 schematically illustrates an embodiment of an internal combustion engine (engine) 10 that may be disposed to supply tractive power in a vehicle 100, and an electric power system that includes a DC power source 40. The term "battery" is used interchangeably with the term "DC power source" throughout the specification. Operation of the engine 10 is preferably controlled by an engine controller 15 in response to operator commands and other factors. The vehicle 100 may include, but not be limited to a mobile platform in the form of a commercial vehicle, industrial vehicle, agricultural vehicle, passenger vehicle, aircraft, watercraft, train, all-terrain vehicle, personal movement apparatus, robot and the like to accomplish the purposes of this disclosure.

The engine 10 may be a suitable internal combustion engine that includes a plurality of cylinders 12 that house pistons that are coupled to a crankshaft 14, wherein internal combustion events cause the pistons to reciprocate in the cylinders 12 to transfer mechanical power to the crankshaft 14. The crankshaft 14 is coupled to a crankshaft pulley 16 and a flywheel 18 that rotate with the crankshaft 14. In one embodiment, and as shown, the crankshaft pulley 16 is disposed on a first end of the engine 10 and the flywheel 18 is disposed on a second, opposite end of the engine 10. The crankshaft 14 mechanically couples to a geartrain 90, which couples via axles or half-shafts 92 to vehicle drive wheels 94 for tractive effort. The geartrain 90 may be a suitable torque transmission device, preferably capable of operating at a suitable gear ratio to transfer torque to the drive wheels 94. In one embodiment, the geartrain 90 is a step-gear transmission. Alternatively, the geartrain 90 may be a continuously variable transmission device, an electrically variable transmission device, or another suitable transmission device. Operation of the geartrain 90 is controlled and monitored by a geartrain controller 95.

The engine 10 includes an electrical charging system 20 and an engine starting system 30. In one embodiment, the electrical charging system 20 includes an electrical generator 22 having a rotor shaft 23 that couples to a first pulley 24, wherein the first pulley 24 is rotatably coupled to the crankshaft pulley 16 via a belt drive mechanism 25 such that the rotor shaft 23 of the electrical generator 22 rotates in concert with and is driven by the crankshaft 14. The electrical generator 22 may be a suitable electric power generating device, and preferably includes a rotor mounted on the rotor shaft 23 and a coaxial stator that convert mechanical power of rotation to electric power through electromagnetic fields, with the electric power being conducted through a rectifier and a voltage regulator to power cables 26. The power cables 26 connect to the DC power source 40 to transfer electric power that is generated by the electrical generator 22 for storage on the DC power source 40. The electrical generator 22 may be configured to be controlled by the engine controller 15, which may command activation of the generator 22 under certain engine operating conditions, such as when the vehicle speed is greater than a minimum threshold, or other suitable conditions. In one embodiment, the engine starting system 30 includes an electrically-powered starter motor 32 having a retractable toothed gear 33 coupled to a rotor of the starter motor 32 and an associated starter solenoid, wherein the retractable gear 33 is disposed to rotatably couple to the flywheel 18 to spin the crankshaft 14 as part of an engine starting routine. Control of the starter motor 32 is effected by a starter switch 36, which is electrically connected to the DC power source 40 via a suitable cable. The descriptions of the electrical charging system 20 and the engine starting system 30 are illustrative. As such, other suitable embodiments of those systems may be employed so long as they operate within the scope of this disclosure.

The DC power source 40 may be a suitable DC electrical power storage device. In one embodiment, the DC power source 40 is a low-voltage electro-chemical battery that operates at a nominal 12V level, although the concepts described herein are not so limited. The DC power source 40 includes a positive terminal 41 and a negative terminal 42, both of which electrically connect to the electrical charging system 20 and the engine starting system 30, either directly or via a positive DC power bus 43 and a negative DC power bus 44, respectively. In one embodiment, the negative DC power bus 44 is connected to a ground 49. A current sensor 46 and a voltage sensor 47 may be disposed to monitor electric power flow through the positive DC power bus 43, and are in communication with a battery controller 45. A temperature sensor 48 may be disposed to monitor temperature of the DC power source 40. The DC power source 40 is disposed to supply electric power to a plurality of DC loads, which are depicted by a common element 50. The DC loads 50 are those loads that consume electric power during vehicle operation. The DC loads 50 may include, by way of non-limiting examples, interior and exterior lighting devices, HVAC devices including fans, engine control devices such as fuel pump(s), fuel injectors, ignition devices, and the like, electric power steering actuators (on vehicles so equipped), electric windows and seats, controller power supplies, and/or other DC load devices.

The DC power source 40 is subjected to parasitic electric power loads, which are depicted by a common element 52. The parasitic loads 52 are those loads that consume electric power when the vehicle is not operating. Examples of parasitic loads 52 include extra-vehicle communications, keep-alive memory elements associated with one of the controllers, and voltage leaks.

The battery controller 45 is disposed to monitor signal inputs from the current sensor 46, the voltage sensor 47 and the temperature sensor 48, to determine states of various parameters that are associated with the DC power source 40, including, e.g., a state of charge (SOC) for the DC power source 40. The SOC can be determined by monitoring current flows and elapsed times associated with charging, discharging and stasis conditions for the DC power source 40, employing suitable algorithms and calibrations.

A human-machine interface (HMI) controller 65 is disposed to monitor operator inputs, including, e.g., operator commands for acceleration, braking, cruise control, and the like.

A diagnostic/service controller 75 communicates with the other on-vehicle controllers via a communication bus 60. The diagnostic/service controller 75 communicates with a service connector 72 that is configured to communicate with an off-board service tool. The service connector 72 can be in the form of a mechanical linkage with communication capability to an off-board device such as a scan tool. Alternatively or in addition, the service connector 72 may include a wireless communication link with communication capability to an off-board device, such as a scan tool. Alternatively or in addition, the service connector 72 includes a telematics module that is capable of communicating via a telecommunications center 85 with an off-board analytical device 82 that is located at a remotely located service center 80.

The terms controller, control module, module, control, control unit, processor and similar terms refer to one or various combinations of Application Specific Integrated Circuit(s) (ASIC), electronic circuit(s), central processing unit(s), e.g., microprocessor(s) and associated non-transitory memory component in the form of memory and storage devices (read only, programmable read only, random access, hard drive, etc.). The non-transitory memory component is capable of storing machine readable instructions in the form of one or more software or firmware programs or routines, combinational logic circuit(s), input/output circuit(s) and devices, signal conditioning and buffer circuitry and other components that can be accessed by one or more processors to provide the described functionality. Input/output circuit(s) and devices include analog/digital converters and related devices that monitor inputs from sensors, with such inputs monitored at a preset sampling frequency or in response to a triggering event. Software, firmware, programs, instructions, control routines, code, algorithms and similar terms mean controller-executable instruction sets including calibrations and look-up tables. Each controller executes control routine(s) to provide desired functions, including monitoring inputs from sensing devices and other networked controllers and executing control and diagnostic instructions to control operation of actuators. Routines may be executed at regular intervals, for example each 100 microseconds during ongoing operation. Alternatively, routines may be executed in response to occurrence of a triggering event. Communication between the controllers, e.g., the engine controller 15, battery controller 45, HMI controller 65, diagnostic/service controller 75 and geartrain controller 95, and communication between controllers, actuators and/or sensors may be accomplished using a direct wired point-to-point link, a networked communication bus link, a wireless link or another suitable communication link, and is indicated by line 60. Communication includes exchanging data signals in a suitable form, including, for example, electrical signals via a conductive medium, electromagnetic signals via air, optical signals via optical waveguides, and the like. The data signals may include discrete, analog or digitized analog signals representing inputs from sensors, actuator commands, and communication between controllers. The term "signal" refers to a physically discernible indicator that conveys information, and may be a suitable waveform (e.g., electrical, optical, magnetic, mechanical or electromagnetic), such as DC, AC, sinusoidal-wave, triangular-wave, square-wave, vibration, and the like, that is capable of traveling through a medium. The term 'model' refers to a processor-based or processor-executable code and associated calibration that simulates a physical existence of a device or a physical process. As used herein, the terms 'dynamic' and 'dynamically' describe steps or processes that are executed in real-time and are characterized by monitoring or otherwise determining states of parameters and regularly or periodically updating the states of the parameters during execution of a routine or between iterations of execution of the routine.

The terms "calibration", "calibrate", and related terms refer to a result or a process that compares an actual or standard measurement associated with a device with a perceived or observed measurement or a commanded position. A calibration as described herein can be reduced to a storable parametric table, a plurality of executable equations or another suitable form. A parameter is defined as a measurable quantity that represents a physical property of a device or other element that is discernible using one or more sensors and/or a physical model. A parameter can have a discrete value, e.g., either "1" or "0", or can be infinitely variable in value.

Figure 21:
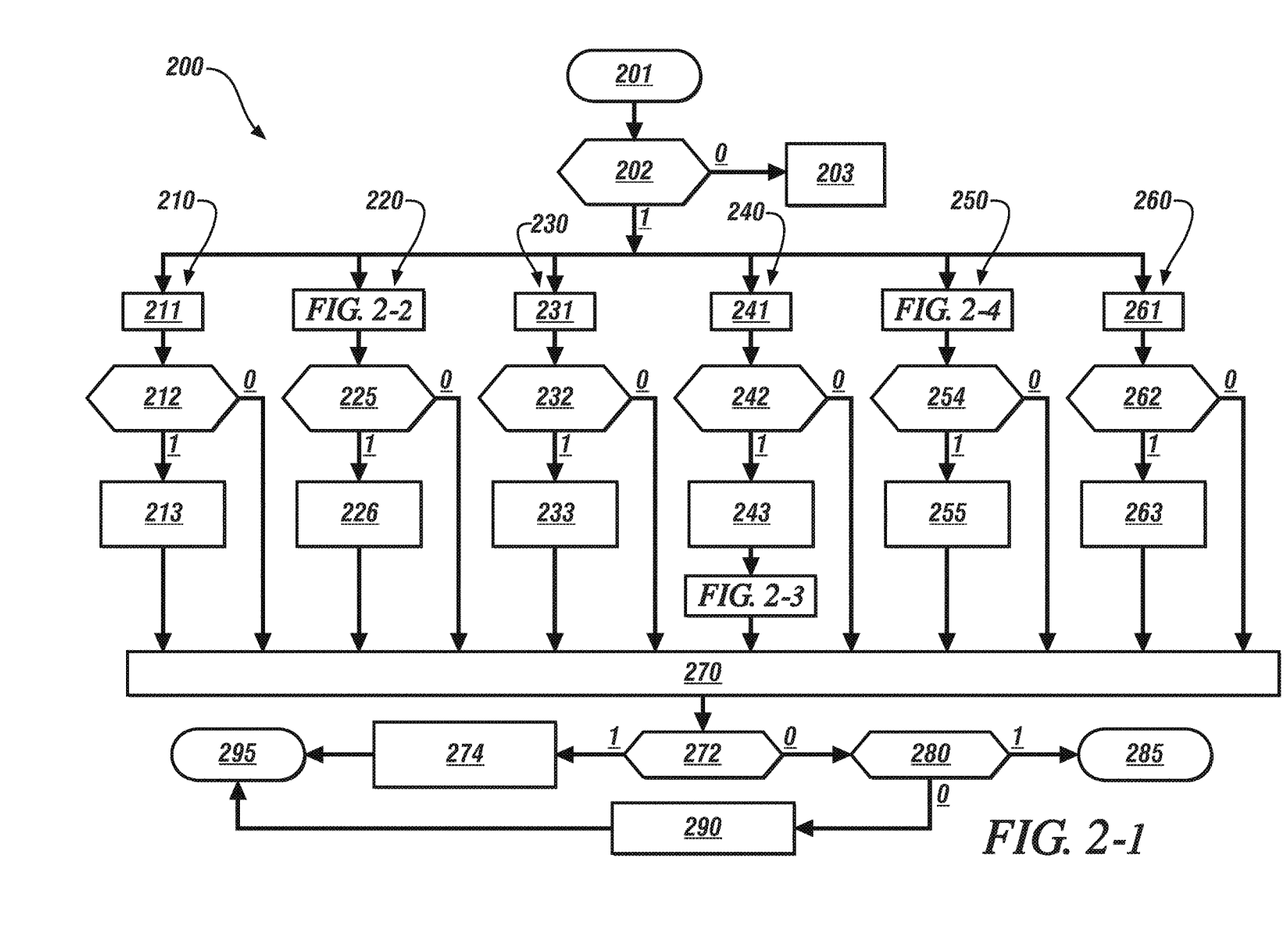

Referring now to FIG. 2-1, with continued reference to the vehicle 100 shown with reference to FIG. 1, a process flowchart is shown that depicts an embodiment of a root cause isolation routine 200 for isolating a root cause associated with a low SOC condition for the DC power source 40 that leads to a non-starting event of the engine 10. The process flowchart 200 may be executed as one or a plurality of algorithms and calibrations that are reduced to code and periodically executed in one or more of the controllers that are disposed on-vehicle. Each iteration (201), the root cause isolation routine 200 monitors and evaluates the SOC of the DC power source 40 by comparing the SOC to a first threshold SOC $Th_1$ (202). The first threshold SOC $Th_1$ is preferably determined as a minimum threshold for the SOC for cranking and starting the engine 10. Suitable processes associated with determining the SOC for the DC power source 40 are understood, and may include monitoring parameters associated with charging/discharging events, coulomb counting, open circuit battery voltage monitoring under predetermined conditions, and the like.

When the DC power source 40 is less than the first threshold SOC $Th_1$, (202)(1), the root cause isolation routine 200 executes a plurality of evaluations (210, 220, 230, 240, 250 and 260) to capture and analyze parameters associated with a plurality of potential root causes of low SOC of the DC power source 40. The evaluations (210, 220, 230, 240, 250 and 260) are executed to determine whether one or more of the potential root causes may be identified as a candidate root cause that leads to low SOC of the DC power source 40. Preferably, these evaluations are executed simultaneously, although that is not required. When the DC power source 40 is greater than the first threshold SOC $Th_1$ (202)(0), this iteration of the root cause isolation routine 200 ends without further activity (203).

The candidate root causes are evaluated (270, 272, and 280). When the routine 200 indicates that there is a single candidate root cause, it is identified as the final root cause that is associated with the low SOC condition for the DC power source 40 (280)(1). When the routine 200 indicates that there are multiple candidate root causes (280)(0), a fault probability is determined for each of the candidate root cause(s) (steps 251, 252, 253). The routine 200 identifies the one of the candidate root cause(s) having the greatest fault probability as the final root cause that is associated with a low SOC condition for the DC power source 40 (290). The final root cause associated with low SOC condition for the DC power source 40 is communicated to the service controller 75, and made available to the vehicle operator via the HMI controller 65, and/or to a service technician via a diagnostic scan tool through the service connector 72 and/or to a remote service facility via telematics. When no candidate root cause is identified, the root cause isolation routine 200 indicates as much (274).

Examples of potential root causes that are associated with low SOC of the DC power source 40 preferably include a root cause that is associated with the DC power source 40, a root cause that is associated with the charging system 20, a root cause that is associated with on-vehicle parasitic loads 52, a root cause that is associated with operator usage and driving patterns of the vehicle 100, and a root cause that is associated with the determination of the SOC of the DC power source 40. There may be other potential root causes, depending upon the specific embodiments of the engine 10, the charging system 20, the engine starting system 30 and the DC power source 40. The concepts described herein apply to other potential root causes that may be identified for the specific embodiment of the engine 10, the charging system 20, the engine starting system 30 and the DC power source 40.

One of the evaluations of the root cause isolation routine 200 includes evaluating the DC power source 40 as a potential root cause that may lead to low SOC of the DC power source 40 (210). Evaluating the DC power source 40 includes, in one embodiment, determining a parameter associated with a state of health (SOH) of the DC power source 40 (211), and comparing the SOH with a threshold SOH $Th_2$ (212). The SOH may be defined as an available electric power capacity of a fully charged battery, and may be presented as a ratio of its original electric power capacity. The SOH may be determined by periodically monitoring voltage, current and temperature states of the DC power source 40 during operation, and subjecting such measurements to a predefined empirical or physical model that may include differential equations and/or equivalent circuits that are reduced to executable algorithms and calibrations that reside in the battery controller 45. In one embodiment, the voltage, current and temperature states and the predefined empirical or physical model may be employed to determine an open-circuit voltage and/or an internal charging resistance of the DC power source 40, which may be analyzed to determine a state for the SOH.

When the SOH of the DC power source 40 is less than the threshold SOH $Th_2$, (212)(1), it identifies the DC power source 40 as a candidate root cause for the low SOC, and determines a first probability P1 associated therewith (213), which is communicated to the candidate root cause compilation step (270) for further evaluation. When the SOH of the DC power source 40 is greater than the threshold SOH $Th_2$, (212)(0), this result is communicated to the candidate root cause compilation step (270).

The first probability P1 associated with the DC power source 40 is determined based upon historical data for a fleet of vehicles.

Figure 22:
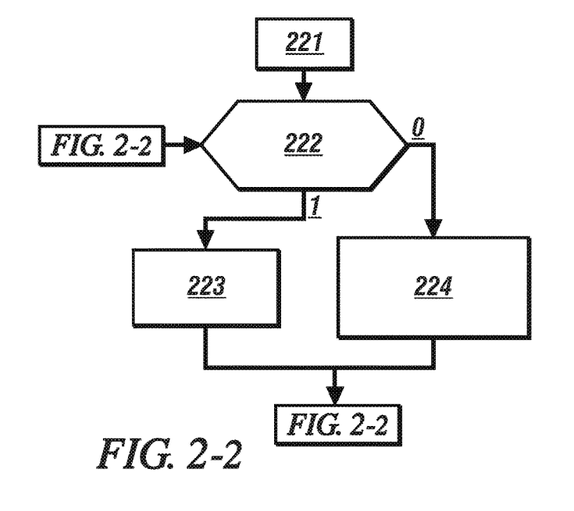

The evaluation of the root cause isolation routine 200 includes evaluating the charging system 20 as a potential root cause that may lead to low SOC of the DC power source 40 (220). The purpose of this evaluation also includes separating the controller circuit and the charging system 20 as potential root causes. FIG. 2-2 schematically shows related elements. The charging system 20 shown in FIG. 1 includes the generator 22 and the belt drive mechanism 25, wherein the generator 22 includes a rectifier and a voltage regulator that electrically connects to the power cables 26. Potential faults related to the charging system 20 include faults with components of the generator 22, belt slip, electrical connector faults, and the like. The engine controller 15 may include multiple routines that monitor various parameters associated with operation of the generator 22 and the belt drive mechanism 25, including routines that generate diagnostic trouble codes as part of an on-board diagnostic monitoring scheme. As such, evaluating the charging system 20 as a potential root cause that may lead to low SOC of the DC power source 40 includes monitoring for occurrence of one or more diagnostic trouble codes related to operation of the generator 22 and/or the belt drive mechanism 25 and the related electrical connections (222). When one or more diagnostic trouble codes related to operation of the generator 22 and/or the belt drive mechanism 25 is detected (222)(1), the identified diagnostic trouble code is captured (223) and communicated to the candidate root cause compilation step (270) for further evaluation. When no diagnostic trouble codes related to operation of the generator 22 and/or the belt drive mechanism 25 are detected (222)(0), a charging system fault probability may be determined (224) based upon information related to probabilities of faults in the charging system 20 (221). Such information may be determined on-vehicle, or may be communicated from a remote source such as a remote vehicle service center (not shown). One example relationship for determining the charging system fault probability ($Ch_{FP}$) may be as follows:

$$Ch_{FP} = P(\text{Belt slip fault}) * (1 - \text{GeneratorSOH}) * (1 - \text{BatGenConnectionSOH})$$

wherein

P(Belt slip fault) represents probability of a belt slip fault,

GeneratorSOH represents a state of health (%) of the generator, and

BatGenConnectionSOH represents a state of health (%) of an electrical connection between the DC power source 40 and the generator 22.

The charging system fault probability ($Ch_{FP}$) can be compared to a threshold value (225). When the charging system fault probability ($Ch_{FP}$) is less than the threshold value (225)(0), this result is communicated to the candidate root cause compilation step (270). When the charging system fault probability ($Ch_{FP}$) is greater than the threshold value (225)(1), it identifies the charging system 20 as a candidate root cause for the low SOC (226), and communicates the charging system fault probability ($Ch_{FP}$) to the candidate root cause compilation step (270) for further evaluation.

The evaluation of the root cause isolation routine 200 includes evaluating the on-vehicle parasitic loads 52 as a potential root cause that may lead to low SOC of the DC power source 40 (230). Evaluating the on-vehicle parasitic loads 52 includes, in one embodiment, monitoring a battery wake-up current (Ib) and/or monitoring the battery current under another condition (231). The battery wake-up current (Ib) represents the magnitude of current associated with a no-electrical load condition, such as may be measured before starting the engine 10 when the vehicle is not operating, and is an indication of parasitic drain on the DC power source. The battery wake-up current (Ib) is compared to a threshold current (232). When the battery wake-up current (Ib) is greater than the threshold current, or when the battery voltage is less than a threshold voltage level (232)(1), it identifies the battery wake-up current (Ib) as a candidate root cause for the low SOC, and determines a third probability P3 associated therewith (233), which is communicated to the candidate root cause compilation step (270) for further evaluation. Otherwise, when the battery wake-up current (Ib) is less than the corresponding threshold or the battery voltage is greater than the corresponding threshold (232)(0), this result is communicated to the candidate root cause compilation step (270).

Figure 23:
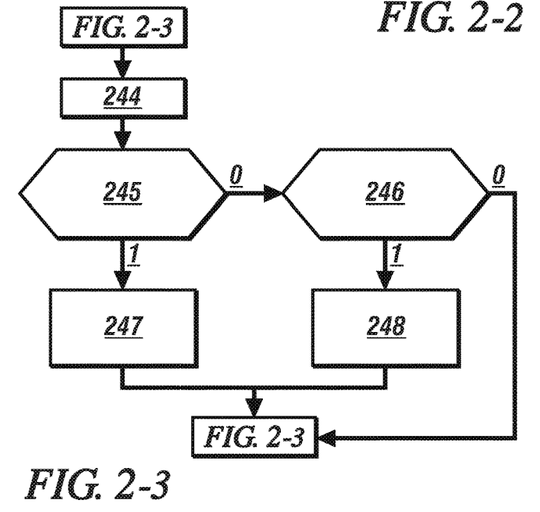

The evaluation of the root cause isolation routine 200 includes evaluating the operator usage and driving patterns of the vehicle 100 as a potential root cause that may lead to low SOC of the DC power source 40 (240). This includes, in one embodiment, monitoring various vehicle operation parameters such as vehicle trip distance or elapsed time of engine operation for the present trip, and/or engine off-time prior to the present trip (241). Operator usage and driving patterns of the vehicle 100 that may lead to low SOC of the DC power source 40 may include multiple short driving trips or extended parking times. When the vehicle trip distance or elapsed time of engine operation for the present trip is less than a threshold distance or time, respectively (242)(1), operator usage and driving patterns are identified as candidate root causes for the low SOC (243), and the analysis proceeds to steps 244, 245, 246, 247 and 248, which are described with reference to FIG. 2-3. FIG. 2-3 schematically shows one process for evaluating the operator usage and driving patterns of the vehicle 100, which includes monitoring and compiling data related to various vehicle operation parameters such as vehicle trip distances and elapsed time of engine operation for a plurality of immediately previous trips and associated engine off-times (244). The vehicle trip distances are compiled and analyzed, e.g., via some form of statistical analysis. When the vehicle trip distances are less than a corresponding threshold distance (245)(1), a driver behavior related to short trip distances is identified as a candidate root cause for the low SOC, and a fifth probability P5 associated therewith is determined (247), and is communicated to the candidate root cause compilation step (270) for further evaluation. When the vehicle trip distances are greater than the corresponding threshold distance (245)(0), the engine off-time and an associated SOC of the DC power source 40 are analyzed (246).

Referring again to FIG. 2-1, the engine off-time and the SOC are compared to corresponding threshold values (246). When the results indicate that the SOC of the DC power source 40 was greater than a threshold value at the time of the previous vehicle shutdown in conjunction with an extended engine off-time thereafter (246)(1), the driver behavior related to an extended parking period is identified as a candidate root cause for the low SOC, and a sixth probability P6 associated therewith is determined (248), and is communicated to the candidate root cause compilation step (270) for further evaluation. Otherwise, when the vehicle trip distance is greater than a threshold distance and the elapsed time of engine operation for the present trip is less than the corresponding threshold distance (242)(0), this result is communicated to the candidate root cause compilation step without further action (270).

Figure 24:
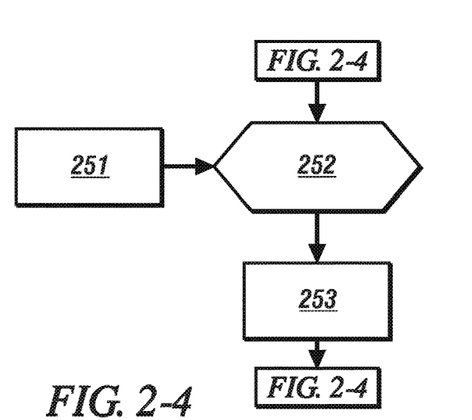

The evaluation of the root cause isolation routine 200 includes evaluating engine cranking events as a potential root cause that may lead to low SOC of the DC power source 40 (250). FIG. 2-4 schematically shows one process for evaluating the engine cranking events, which includes monitoring and compiling data related to various subsystems associated with engine cranking events for a plurality of immediately previous trips and the associated engine off-times (251). Such subsystems may include, by way of example, the engine starting system 30, the DC power source 40, an engine fueling system (not shown), and others. Monitoring may include monitoring parameters employed in various on-board diagnostic evaluations and related diagnostic trouble codes. The parameters associated with the monitored subsystems are evaluated (252) and one of the monitored subsystems may be identified as a least healthy starting subsystem (253), along with a seventh probability P7. This evaluation further considers the quantity of previously occurring cranking events that have occurred with subsequent engine run time of less than a threshold time period. When this quantity of previously occurring cranking events that have occurred is greater than a threshold (254)(1), the quantity of cranking events is identified as a candidate root cause for the low SOC, and a sixth probability P6 associated therewith is determined (255), and is communicated to the candidate root cause compilation step (270) for further evaluation. Otherwise, when this quantity of previously occurring cranking events is less than the threshold (254)(0), this result is communicated to the candidate root cause compilation step (270).

The evaluation of the root cause isolation routine 200 includes evaluating devices and algorithms that are employed to monitor the DC power source 40 as potential root causes that may lead to low SOC of the DC power source 40 (260). This includes monitoring parameters employed in various on-board diagnostic evaluations and related diagnostic trouble codes associated with monitoring the DC power source 40, including, e.g., the current sensor 46 and the voltage sensor 47 disposed to monitor electric power flow and the temperature sensor 48 disposed to monitor temperature of the DC power source 40 (261). The parameters associated with monitoring the DC power source 40 are evaluated (262). When the evaluation indicates that the measured SOC of the DC power source 40 may not accurately represent the actual SOC of the DC power source 40 due to sensor or other errors (262)(1), the evaluating devices and algorithms that are employed to monitor the DC power source 40 are identified as a candidate root cause for the low SOC, and a fourth probability P4 associated therewith is determined (263), and is communicated to the candidate root cause compilation step (270) for further evaluation. Otherwise (262)(0), absence of such a result is communicated to the candidate root cause compilation step (270).

The candidate root cause compilation step (270) compiles the outcomes from the aforementioned evaluations (210, 220, 230, 240, 250 and 260), which are evaluated (272) to determine whether there one or more of the potential root causes has been identified as a candidate root cause (272). When none of the potential root causes has been identified as a candidate root cause (272)(1), the routine 200 indicates that the root cause is unidentified (274), along with a command to have service or repair personnel inspect the battery and charging system, and this iteration ends (295).

When one or more of the potential root causes has been identified as a candidate root cause (272)(0), the routine 200 determines whether there is a single candidate root cause (280)(1) or multiple root causes (280)(0). When there is a single candidate root cause (280)(1), it is identified as the final root cause, taking into account the fault probabilities (285).

When multiple candidate root causes for low SOC are identified (280)(0), the multiple candidate root causes are evaluated based upon their fault probability p and occurrence probability w. This includes calculating a final root cause RC from each of the candidate root causes, as follows:

$$RC_i = w_i * p_i$$

wherein:

$RC_i$ is the root cause parameter for the candidate root cause, $w_i$ is the occurrence probability for the candidate root cause based upon historical probabilities, $p_i$ is the fault probability of a particular fault associated with the candidate root cause, and i is an index indicating individual candidate root causes.

The final root cause is selected as the candidate root cause having the maximum value for the root cause parameter $RC_i$. The fault probability for the candidate root cause $p_i$ may be determined employing suitable fault probability analysis techniques. To evaluate $p_i$, the outputs from the decision blocks from previous L trips are weighted to generate the probabilistic confidence in declaring a root cause.

The flowcharts and block diagrams in the flow diagrams illustrate the architecture, functionality, and operation of possible implementations of systems, methods, and computer program products according to various embodiments of the present disclosure. In this regard, each block in the flowchart or block diagrams may represent a module, segment, or portion of code, which includes one or more executable instructions for implementing the specified logical function(s). It will also be noted that each block of the block diagrams and/or flowchart illustrations, and combinations of blocks in the block diagrams and/or flowchart illustrations, may be implemented by an ASIC that is configured to perform the specified functions or acts, or combinations of ASICs and computer instructions. These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The detailed description and the drawings or figures are supportive and descriptive of the present teachings, but the scope of the present teachings is defined solely by the claims. While some of the best modes and other embodiments for carrying out the present teachings have been described in detail, various alternative designs and embodiments exist for practicing the present teachings defined in the appended claims.

The invention claimed is:

1. A method for monitoring a DC power source that is electrically connected to a charging system that is disposed on an internal combustion engine that is disposed on a vehicle, the method comprising:
   determining a State of Charge (SOC) for the DC power source; and
   upon detecting that the SOC is less than a threshold SOC that is associated with starting the internal combustion engine:
      evaluating, via a controller, states associated with a plurality of potential root causes related to the SOC being less than the threshold SOC,
      determining that at least one of the potential root causes is a candidate root cause based upon the states,
      determining a fault probability for each candidate root cause, and
      determining that one of the candidate root causes is a final root cause based upon the fault probabilities associated with each of the candidate root causes; and
   communicating, via a service connector, the final root cause from the controller to an off-board device.

2. The method of claim 1, wherein determining a fault probability for each candidate root cause comprises determining a probability of occurrence for each candidate root cause and determining a probability of fault for each candidate root cause.

3. The method of claim 1, wherein determining that one of the candidate root causes is a final root cause based upon the fault probabilities associated with the candidate root causes comprises selecting the one of the candidate root causes having the greatest fault probability as the final root cause.

4. The method of claim 1, wherein evaluating a plurality of potential root causes associated with the low SOC comprises evaluating a state of health of the DC power source.

5. The method of claim 1, wherein evaluating a plurality of potential root causes associated with the low SOC comprises evaluating performance of a charging system disposed to supply electric power to charge the DC power source.

6. The method of claim 1, wherein evaluating a plurality of potential root causes associated with the low SOC comprises evaluating a wake-up current associated with the DC power source.

7. The method of claim 1, wherein evaluating a plurality of potential root causes associated with the low SOC comprises evaluating engine operation and vehicle usage related to charging of the DC power source.

8. The method of claim 1, wherein evaluating a plurality of potential root causes associated with the low SOC comprises evaluating engine starting events.

9. The method of claim 1, wherein evaluating a plurality of potential root causes associated with the low SOC comprises evaluating on-board devices that are disposed to monitor the DC power source.

10. The method of claim 9, wherein evaluating on-board devices that are disposed to monitor the DC power source comprises evaluating a current sensor, a voltage sensor and a temperature sensor.

11. The method of claim 1, wherein determining the SOC for the DC power source comprises monitoring current flow into and out of the DC power source.

12. An internal combustion engine of a vehicle, comprising:
   a starting system that is electrically connected to a DC power source that is electrically connected to a charging system;
   an electrical charging system electrically connected to the DC power source;
   a service connector; and
   a controller, in communication with the internal combustion engine, the starting system, the electrical charging system, the service connector, and the DC power source, the controller including an instruction set, the instruction set executable to:
      determine a State of Charge (SOC) for the DC power source, and determine that the SOC is less than a threshold SOC,
      evaluate states associated with a plurality of potential root causes associated with the SOC being less than the threshold SOC,
      determine that at least one of the potential root causes is a candidate root cause based upon the evaluated states,
      determine a fault probability for each of the candidate root causes,
      determine that one of the candidate root causes is a final root cause based upon the fault probabilities associated with the candidate root causes, and
      communicate, via the service connector, the final root cause from the controller to an off-board device.

13. A service controller for a vehicle that includes an internal combustion engine, a starting system, a DC power source, an electrical charging system, comprising:
   the service controller being in communication with a service connector and in communication with the internal combustion engine, the starting system, the electrical charging system and the DC power source, the controller including an instruction set, the instruction set executable to:
      determine a State of Charge (SOC) for the DC power source, and determine that the SOC is less than a threshold SOC,
      evaluate states associated with a plurality of potential root causes associated with the SOC being less than the threshold SOC,
      determine that at least one of the potential root causes is a candidate root cause based upon the evaluated states,
      determine a fault probability for each of the candidate root causes,
      determine that one of the candidate root causes is a final root cause based upon the fault probabilities associated with the candidate root causes; and
      communicate, via the service connector, the final root cause from the controller to an off-board device.

14. The service controller of claim 13, wherein the service connector is disposed to communicate the final root cause from the controller to an off-board service tool.

15. The service controller of claim 14, wherein the service connector includes a mechanical linkage and a communication link to the off-board service tool.

16. The service controller of claim 14, wherein the service connector includes a wireless communication link to the off-board service tool.

17. The service controller of claim 14, wherein the service connector includes a telematics module disposed to communicate to the off-board service tool.

18. The service controller of claim 14, wherein the off-board service tool is remotely located from the vehicle.

* * * * *